(12) United States Patent
Srivastava et al.

(10) Patent No.: US 8,239,808 B2
(45) Date of Patent: Aug. 7, 2012

(54) ROUTING SYSTEM

(75) Inventors: Himanshu Srivastava, Noida (IN); Jyoti Malhotra, Haryana (IN)

(73) Assignee: STMicroelectronics International N.V., Amsterdam (NL)

(*) Notice: Subject to any disclaimer, the term of this patent is extended or adjusted under 35 U.S.C. 154(b) by 229 days.

(21) Appl. No.: 12/630,791

(22) Filed: Dec. 3, 2009

(65) Prior Publication Data

US 2010/0146473 A1 Jun. 10, 2010

(30) Foreign Application Priority Data

Dec. 5, 2008 (IN) .......................... 2769/DEL/2008

(51) Int. Cl.
*G06F 17/50* (2006.01)

(52) U.S. Cl. ...................... 716/129; 716/110; 716/126

(58) Field of Classification Search .................. 716/129
See application file for complete search history.

(56) References Cited

U.S. PATENT DOCUMENTS

| 5,550,748 | A | * | 8/1996 | Xiong ........................... 716/129 |
| 5,717,600 | A | | 2/1998 | Ishizuka |
| 7,111,268 | B1 | * | 9/2006 | Anderson et al. ............. 716/113 |
| 7,134,112 | B1 | | 11/2006 | Anderson et al. |
| 7,571,411 | B2 | | 8/2009 | Hentschke et al. |
| 7,853,915 | B2 | | 12/2010 | Saxena et al. |
| 2007/0159984 | A1 | | 7/2007 | Hentschke et al. |
| 2008/0170514 | A1 | | 7/2008 | Hentschke et al. |

OTHER PUBLICATIONS

Cormen, Thomas H. et al., "Introduction to Algorithms, Second Edition", The MIT Press, McGraw-Hill Book Company, 2001, pp. 595-601.
Dijkstra, E.W., "A Note on Two Problems in Connexion with Graphs", Numerische Mathematik 1, pp. 269-271, 1959.

* cited by examiner

*Primary Examiner* — Paul Dinh
*Assistant Examiner* — Bryce Aisaka
(74) *Attorney, Agent, or Firm* — Gardere Wynne Sewell LLP

(57) ABSTRACT

A process for shortest path routing in computer-aided designs (CAD) is performed using an incremental graph traversal technique. This technique searches the shortest path routing trees in a graph by path exploration limited only to an incremented search region thereby reducing run time complexity. Graph traversal begins in the incremented search region, and propagates successive changes thereafter.

10 Claims, 3 Drawing Sheets

ROUTING SYSTEM

PRIORITY CLAIM

This application claims priority from Indian Patent Application 2769/Del/2008 filed Dec. 5, 2008, the disclosure of which is incorporated by reference.

TECHNICAL FIELD

The present disclosure relates to computer-aided designs (CAD) and, more specifically, to routing in integrated circuits.

BACKGROUND

Routing in large integrated circuits or electronic networks is automatically performed by a routing mechanism known as a "router" which is typically implemented as a software tool on a computer-aided design (CAD) system.

In a CAD system, modern routers try to identify routing paths through a routing resource graph. These routers primarily consider various routing alternatives available in the resource graph prior to routing. Each routing alternative available in the resource graph comprises nets which further comprise a combination of sources and sinks.

The routing resource graph is a data structure that establishes links between a set of nodes (also called vertices) and a set of edges. It is represented by G (V, E), where vertex v∈V, represents a grid cell, a node or a conductor (e.g., wire) and each edge e∈E, corresponds to a boundary between two adjacent grid cells, nodes or wires.

Typical operations associated with routing resource graphs are: finding a path between two nodes and finding the shortest path from one node to another.

Dijkstra's shortest path routing method is one known method for single-source shortest path routing (see, Dijkstra, E. W. (1959) "A note on two problems in connection with graphs" Numerische Mathematik 1: 269-271; and Cormen, et al (2001) "Section 24.3: Dijkstra's algorithm" Introduction to Algorithms (Second ed.), MIT Press and McGraw-Hill, pp. 595-601; the disclosures of which are hereby incorporated by reference). It computes length of the shortest path from the source to each of the remaining vertices in the graph. Dijkstra's method determines the distances (costs) between a given vertex and remaining vertices in a graph. This method begins at a specific vertex and extends outward within the graph, until all vertices have been reached. The process of visiting all nodes in a graph is known as graph traversal.

However, Dijkstra routing method used in its original/unmodified form as known to those skilled in the art searches the entire graph in order to construct the routing tree, due to which this method results in increased run time complexity and reduced performance of the router by visiting all the vertices in every execution.

SUMMARY

The present disclosure describes routing in computer-aided designs (CAD) by means of incremental graph traversal. This computer-aided-design system comprises a routing module, said routing module comprising: a search region identifying module; and an incremental graph traversal routing module. The incremental graph traversal routing module further comprises: a source-sink routing path estimator; and a routing processor.

According to another embodiment, method steps for computer-aided-design comprise: identifying a search region; and processing an incremental graph traversal routing. Further, the search region is identified by generating a bounding box region along the grid points circumscribing a source and spaced there from at a predetermined distance. The incremental graph traversal processing estimates the source-sink routing path. If the available routing path is found, said sinks are routed with the source net else the search region is incremented uniformly by one unit, and the routing is performed in the incremented search region only.

BRIEF DESCRIPTION OF THE DRAWINGS

The present disclosure explains the various embodiments to the instant disclosure in the following description, taken in conjunction with the accompanying drawings, wherein.

DETAILED DESCRIPTION OF THE DRAWINGS

The embodiments of the present disclosure will be described in detail with reference to the accompanying drawings. However, the present disclosure is not limited to the embodiments described herein. The disclosure is described with reference to specific circuits, block diagrams, signals, etc. simply to provide a more thorough understanding of the disclosure.

Figure 1:
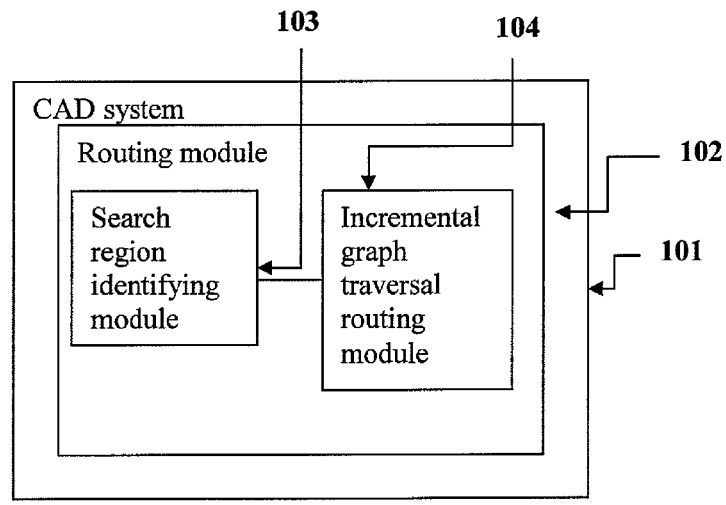
FIG. 1 illustrates a block diagram of a routing module in a computer-aided-design system according to the present disclosure.

FIG. 1 illustrates a block diagram of a routing module in a computer-aided-design system according to the present disclosure. A computer-aided-design system 101 comprises a routing module 102. This routing module 102 further comprises a search region identifying module 103 and an incremental graph traversal routing module 104.

Figure 2:
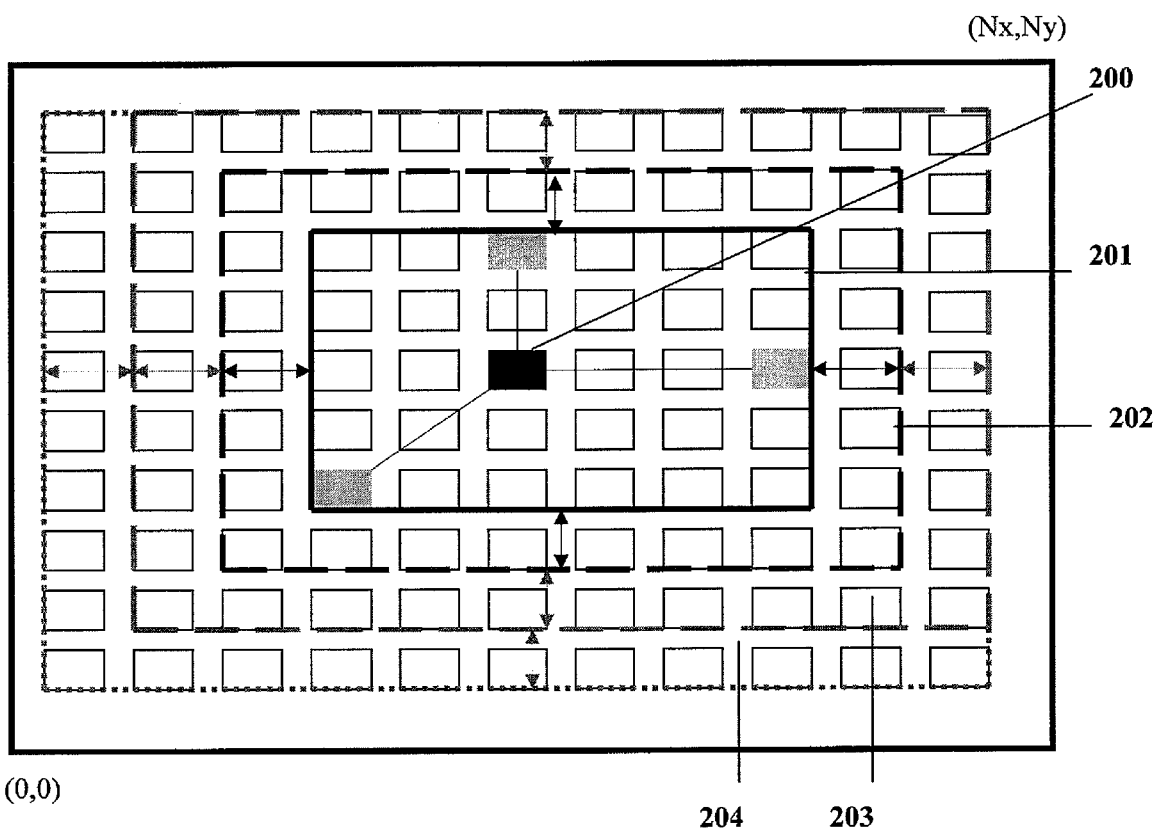
FIG. 2 illustrates finding of a search region by a search region identifying module of the present disclosure.

FIG. 2 illustrates the finding of a search region by an identifying module of the present disclosure. A search region is identified by generating a rectilinear region known as bounding box 201. The bounding box is an expression of the maximum extents of a net from the source block 200. The wire-length of a net enclosed within the bounding box is approximated as a half perimeter wire-length value of the bounding box. Initially, the path exploration is limited to the bounding box region 201 and trying to find a suitable shortest source-sink path. If the routing path is available then the search is completed; else the search region is incremented gradually by one unit. This search is continued further in incremental steps, until the search region equals the chip dimension and the routing is performed in the incremented search region only. After a first increment, the set of graph in the incremented region is shown by $\Delta G_1 (V_1, E_1)$ 202. Similarly, the other incremented regions are $\Delta G_2 (V_2, E_2)$ 203 and $\Delta G_3 (V_3, E3)$ 204.

Figure 3:
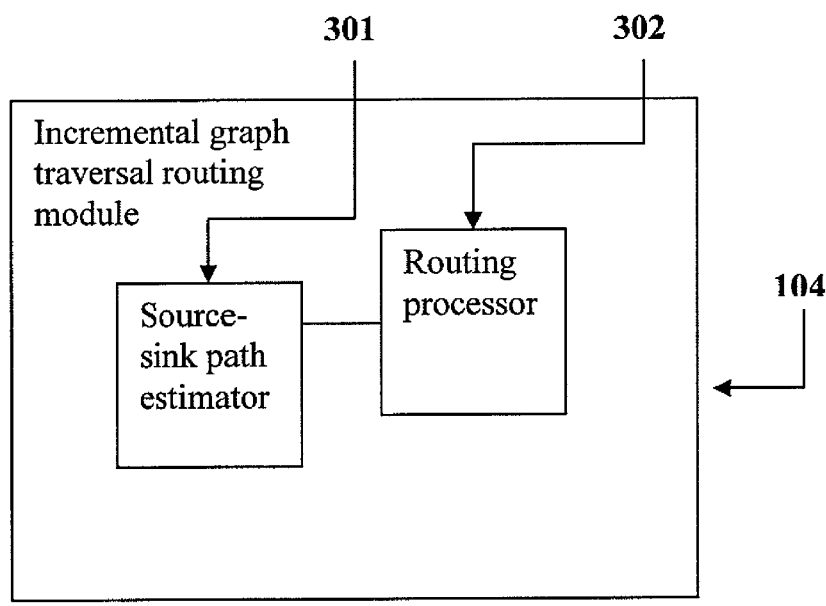
FIG. 3 illustrates a block diagram of an incremental graph traversal routing module according to an embodiment of the present disclosure.

FIG. 3 illustrates a block diagram of an incremental graph traversal routing module according to an embodiment of the present disclosure. The incremental graph traversal routing module 104 comprises a source-sink path estimator 301, for estimating the shortest source-sink path in the bounding-box region (based on the Dijikstra algorithm) and a routing processor 302, for first computing the routing in the initial search region when the shortest source-sink path is available. Otherwise, the net routing is performed only in the incremented search region. Thereby, the run time complexities of the routing system are reduced.

Figure 4:
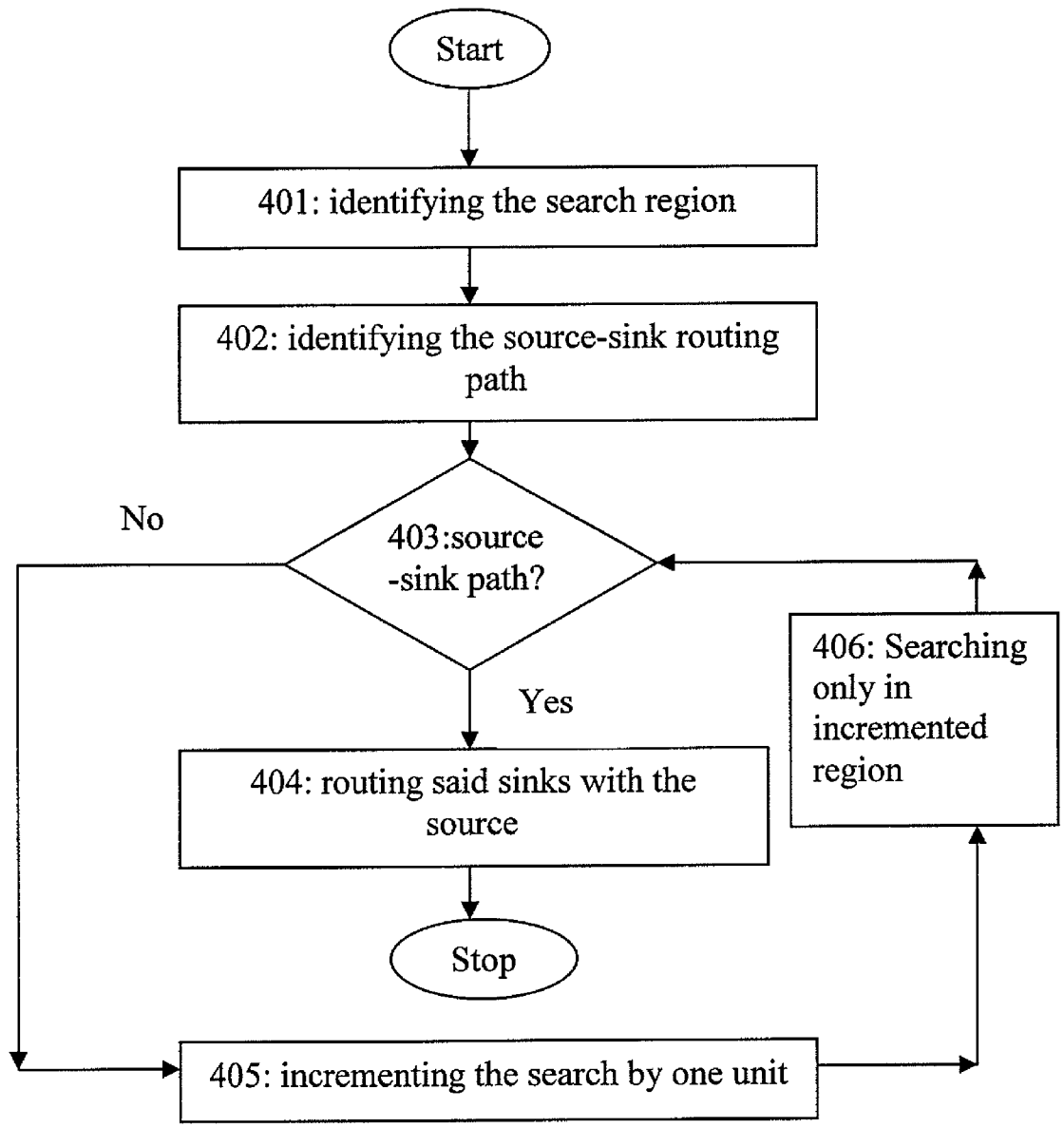
FIG. 4 illustrates a flow chart for a method for incremental routing according to an embodiment of the present disclosure.

Embodiments of the method for incremental routing are described in FIG. 4. The methods are illustrated as a collection of blocks in a logical flow graph, which represents a sequence of operations that can be implemented in hardware, software, or a combination thereof. The order in which the process is described is not intended to be construed as a limitation, and any number of the described blocks can be combined in any order to implement the process, or an alternate process.

FIG. 4 illustrates a flow chart for method for incremental routing according to an embodiment of the present disclosure. In step 401, the execution of incremental graph traversal begins with identifying the search region, i.e. the bounding box 201. In step 402, the path exploration or graph traversal begins to find a shortest path for a given net of the source sink list (or routing tree) according to the Dijikstra algorithm by identifying the source sink routing path. A test is made in step 403 as to whether the path is found. In step 404, if the source-sink path is found then routing is completed for a net. Otherwise, in step 405 the search region is incremented according to a defined factor of increment index, i.e. unit 1. Again the graph traversal begins but only in the incremented search region and not in the previous region (step 406). This process is repeated until the search region equals the chip dimension. The following pseudo codes explain the complete process:

```
Find_path (Graph G (V, E), v [ ] source_sink_list)
{
    Let search Region represent the current space within which
    traversal is limited
    Initialize search Region with bounding box of source_sink_list
    Let current Increment Index be index pointing to number of
times the search region was incremented, initialized to −1
    Initialize number SinksToFind = number of sinks of the net
    Do
    {
        If (incremental Dijikstras (G, source_sink_list))
        {
        numberSinksToFind--;
        }
        Else
        {
        incrementSearchRegion (searchRegion)
        }
    }
    while (number SinksToFind)
}
```

As given in the aforementioned pseudo codes, the function incrementalDijkstra is called to find the sink for the specified search region. Further, the other parameters used to perform the next function are expressed in sub functions such as sink_checks and eligibility_criteria.

```
Bool incrementalDijikstras( )
{
    Bool sinkFound = false;
    Run Dijikstra's algorithm with the following modifications
    1.      sink_checks( )
        a.   update sinkFound with return of sink_checks ( )
    2.      eligibility_criteria ( )
    return sinkFound
}
```

The function sink_checks is used to find nodes in the specified search region. A shortest path routing tree is constructed, as given in the following pseudo codes:

```
Bool sink_checks ( )
{
    Let topNode be the current node de- queued from the
    priority queue.
    Return true if topNode.target == true else continue with the
    normal execution
}
```

Further, the function eligibility_criteria establishes the measures of path exploration to find sinks based on path cost of the nodes, within the specified search region as given in the following pseudo codes:

```
eligibility_criteria ( )
{
    V & topNode = dequeue( )
    For (each node v ∈ adj[topNode] )
    {
        updateChildNode(topNode, v)
        If (withinSearchRegion(v) )
        {
            enqueue (v)
        }
        else
        {
            incrementalGraphContainerPopulation (v)
        }
    }
}
update ChildNode(topNode, v)
{
    Mark v's parent as topNode
    Mark v as visted
    Mark v's pathcost as wt_edge(topNode,v) + pathcost of topNode;
}
withinSearchRegion(v)
{
    Get the bounding dimensions of the current search region
    See is v's coordinates lie within this bounding box
}
```

When the desired shortest routing path tree was not constructed in the given bounding box region 201 then the search region is incremented to the next level. The function Incrementalgraphcontainerpopulation computes the incremented search region by declaring an array of lists in Incremental_graph_container [i] (given by $\Delta G_{i+1}(V_{i+1}, E_{i+1})$). The size of array Incremental_graph_container is computed in the following manner:

Maximum Number of Top Right Increments $$(TopIncrs) = max[(Nx-MaxX/incrementFactor), (Ny-MaxY/incrementFactor)]$$

Maximum Number of Bottom Left Increments $$(BotIncrs) = max[(MinX/incrementFactor), (MinY/incrementFactor)]$$

The total size of Incremental_graph_container is given by max(TopIncrs, BotIncrs), where, (<Nx, Ny>, <0, 0>) represents the coordinates of the complete chip bounding box and incrementFactor is units with which a search region is incremented.

Figure 5:
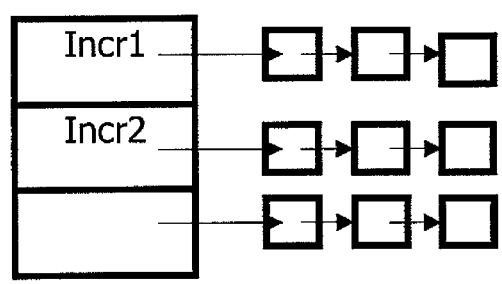
FIG. 5 illustrates adjacency list in accordance with an embodiment of the present disclosure.

Furthermore, this array list for IncrementalGraphContainerPopulation (v), is a type of adjacency list representation as shown in FIG. 5. While computing for the specified search region the nodes are stored in the array and further populated in the list after each increment till the shortest path routing tree is constructed. The following pseudo codes illustrates about the function IncrementalGraphContainerPopulation (v):

```
IncrementalGraphContainerPopulation (v)
{
    Get v's coordinates
    Compute the search region increment which will eventually contain
    v, say "I"
    Push v at the tail of list given by Incremental_graph_container [I]
}
```

The function incrementSearchRegion increments the complete search region uniformly in all direction based on the constant value of incrementIndex.

```
incrementSearchRegion (searchRegion)
{
    currentIncrementIndex ++;
    Populate priority queue with nodes in list at
    Incremental_graph_container [currentIncrementIndex]
    Let (<MinX,MinY> , <MaxX,MaxY> ) represent bounding box of
    searchRegion
        MinX -= incrementFactor;
        MinX = (MinX <0 ?0: MinX)
        MinY -= incrementFactor;
        MinY = (MinY <0 ?0: MinY)
        MaxX += incrementFactor;
        MaxX = (MaxX >Nx ?Nx: MaxX)
        MaxY += incrementFactor;
        MaxY = (MaxY >Ny ? Ny: MaxY)
}
```

The embodiment of the present disclosure can be used in various applications for finding shortest path routes in FPGA chip architectures, communication networks, traffic information systems, etc.

Although the disclosure of the instant disclosure has been described in connection with the embodiment of the present disclosure illustrated in the accompanying drawings, it is not limited thereto. It will be apparent to those skilled in the art that various substitutions, modifications and changes may be made thereto without departing from the scope and spirit of the disclosure.

The various embodiments described above can be combined to provide further embodiments. Aspects of the embodiments can be modified, if necessary, to employ concepts of the known prior art to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

While the disclosure will be described in conjunction with the illustrated embodiment, it will be understood that it is not intended to limit the disclosure to such embodiment. On the contrary, it is intended to cover all alternatives, modifications and equivalents as may be included within the spirit and scope of the disclosure as defined by the appended claims.

What is claimed is:

1. A method for routing from a source to a sink on a chip with a chip dimension, comprising:
   identifying a first bounding box on the chip defining a first search region, wherein said first bounding box has a size which is smaller than said chip dimension;
   performing graph traversal solely within the first search region using a source-sink routing path estimator to find a shortest path for a given net of a source sink list according to a shortest path algorithm by identifying a source sink routing path;
   determining by a routing processor whether the shortest path has been found;
   if so, then completing routing for a net;
   if not, incrementing the size of the first search region according to a defined factor of an increment index to identify a second bounding box defining a second search region which contains the first search region; and
   performing graph traversal again using a source-sink routing path estimator but only in an incremented portion of the second search region which is outside of the first search region.

2. The method of claim 1 further comprising repeating the incrementing and performing graph traversal again steps of claim 1 until a size of the incremented search region equals a size of said chip dimension.

3. The method of claim 2 wherein the shortest path algorithm is Dijikstra's algorithm.

4. A non-transitory computer readable storage medium having stored thereon computer program code that, when executed by a processor, performs steps for routing from a source to a sink on a chip with a chip dimension by:
   identifying a first bounding box on the chip defining a first search region, wherein said first bounding box has a size which is smaller than said chip dimension;
   performing graph traversal solely within the first search region to find a shortest path for a given net of a source sink list according to a shortest path algorithm by identifying a source sink routing path;
   determining whether the shortest path has been found;
   if so, then completing routing for a net;
   if not, incrementing the size of the first search region according to a defined factor of an increment index to identify a second bounding box defining a second search region which contains the first search region; and
   performing graph traversal again but only in an incremented portion of the second search region which is outside of the first search region.

5. The medium of claim 4 further comprising repeating the incrementing and performing graph traversal again steps of claim 1 until a size of the incremented search region equals a size of said chip dimension.

6. The method of claim 4 wherein the shortest path algorithm is Dijikstra's algorithm.

7. A computer-aided-design system, comprising a routing module including:
   a search region identifying module; and
   an incremental graph traversal routing module,
   wherein the search region identifying module is configured to:
      identify a first bounding box defining a first search region, wherein said first bounding box has a size which is smaller than said chip dimension; and
      identify a second bounding box defining a second search region which is larger than and wholly contains the first search region; and wherein the incremental graph traversal routing module is configured to:

perform graph traversal solely within the first search region to find a shortest path for a given net of a source sink list according to a shortest path algorithm by identifying a source sink routing path;

determine whether the shortest path has been found; and if not, perform additional graph traversal only in an incremented portion of the second search region which is outside of the first search region to find the shortest path.

8. The system of claim 7, wherein search region identifying module operation to identify the second bounding box is performed only if the shortest path is not found when performing graph traversal solely within the first search region.

9. The system of claim 7, wherein the incremental graph traversal routing module further comprises a routing processor configured to complete routing for a net in accordance with the found shortest path.

10. The system of claim 7, wherein the search region identifying module is further configured, if the shortest path has not been found, to identify an additional bounding box defining an additional search region which is larger than and wholly contains the first and second search regions, and wherein the incremental graph traversal routing module is further configured to perform additional graph traversal only in an incremented portion of the additional search region which is outside of the second search region to find the shortest path.

\* \* \* \* \*